(12) United States Patent
Fujiyoshi

(10) Patent No.: US 12,019,109 B2
(45) Date of Patent: Jun. 25, 2024

(54) CAPACITANCE DETECTION DEVICE AND CAPACITANCE DETECTION METHOD

(71) Applicant: Alps Alpine Co., Ltd., Tokyo (JP)

(72) Inventor: Tatsumi Fujiyoshi, Miyagi-ken (JP)

(73) Assignee: Alps Alpine Co., Ltd., Tokyo (JP)

(*) Notice: Subject to any disclaimer, the term of this patent is extended or adjusted under 35 U.S.C. 154(b) by 188 days.

(21) Appl. No.: 17/721,238

(22) Filed: Apr. 14, 2022

(65) Prior Publication Data

US 2022/0244299 A1 Aug. 4, 2022

Related U.S. Application Data

(63) Continuation of application No. PCT/JP2020/038199, filed on Oct. 8, 2020.

(30) Foreign Application Priority Data

Nov. 7, 2019 (JP) .................................. 2019-202625

(51) Int. Cl.
*G01R 27/26* (2006.01)
*G01R 15/16* (2006.01)
*G01R 19/165* (2006.01)
*G01R 19/30* (2006.01)
*G01R 27/00* (2006.01)
(Continued)

(52) U.S. Cl.
CPC ......... *G01R 27/2605* (2013.01); *G06F 3/044* (2013.01); *H03K 17/955* (2013.01); *H03K 2217/96071* (2013.01)

(58) Field of Classification Search
CPC ........ G01R 27/00; G01R 27/26; G01R 19/30; G01R 15/16; G01R 19/165; G06F 3/041; G06F 3/044; H03K 17/955; G01V 3/08
See application file for complete search history.

(56) References Cited

U.S. PATENT DOCUMENTS 7,161,360 B2    1/2007  Hirota et al.
9,151,792 B1*  10/2015  Kremin ................... G06F 1/169
2019/0294297 A1  9/2019  Sasai et al.

FOREIGN PATENT DOCUMENTS

JP         4198306        12/2008
WO       2018/116706       6/2018
WO    WO-2018116706 A1 *  6/2018  ............. G01R 27/26

* cited by examiner

*Primary Examiner* — Neel D Shah
(74) *Attorney, Agent, or Firm* — Beyer Law Group LLP

(57) ABSTRACT

A capacitance detection device detecting a capacitance between a detection electrode and a detection target close to the detection electrode has: a first voltage output circuit that outputs a first alternating current voltage to be supplied to a shield electrode placed close to the detection electrode; a second voltage output circuit that outputs a second alternating current voltage with substantially the same frequency as the first alternating current voltage; and an operational amplifier that amplifies the difference in voltage between an inverting input terminal connected to the detection electrode and a non-inverting input terminal to which the second alternating current voltage is applied, and outputs the amplified difference in voltage. With the detection target close to the detection electrode, the second voltage output circuit outputs the second alternating current voltage adjusted so that an output voltage from the operational amplifier has a smaller amplitude than the first alternating current voltage.

11 Claims, 9 Drawing Sheets

(51) Int. Cl.
*G01V 3/08* (2006.01)
*G06F 3/041* (2006.01)
*G06F 3/044* (2006.01)
*H03K 17/955* (2006.01)

CAPACITANCE DETECTION DEVICE AND CAPACITANCE DETECTION METHOD

CLAIM OF PRIORITY

This application is a Continuation of International Application No. PCT/JP2020/038199 filed on Oct. 8, 2020, which claims benefit of Japanese Patent Application No. 2019-202625 filed on Nov. 7, 2019. The entire contents of each application noted above are hereby incorporated by reference.

BACKGROUND OF THE INVENTION

1. Field of the Invention

The present invention relates to a capacitance detection device and a capacitance detection method.

2. Description of the Related Art

A known input device such as a touch sensor or touch pad detects proximity of a detection target such as a finger according to a capacitance. Types of capacitance detection used in input devices are generally classified into a mutual capacitance type and a self-capacitance type. In the mutual detection type, a capacitance is detected between two electrodes placed so as to cross each other. In the self-capacitance type, a capacitance is detected between ground and a detection electrode.

The self-capacitance type is advantageous over the mutual capacitance type in that detection sensitivity for a capacitance is high. However, if a large parasitic capacitance is present between ground and the detection electrode, the parasitic capacitance component occupies a large ratio in the signal indicating a detection result and the dynamic range of the capacitive component of the detection target is reduced. This lowers detection sensitivity. In addition, capacitance variations in the parasitic capacitance become noise. This lowers detection sensitivity for the capacitance.

Conventionally, to reduce this type of effect of the parasitic capacitance, a shield electrode (also referred to as an active shield) driven to the same potential as the detection electrode is placed around the detection electrode (see Japanese Patent No. 4198306, for example). When the active shield is provided, the detection electrode does not easily generate capacitive coupling between the detection electrode and the surrounding conductor, so the parasitic capacitance is reduced. Also, when the active shield has the same potential as the detection electrode, the capacitance between the active shield and the active shield does not affect the detection result. International Publication No. 2018/116706 is another example of the related art.

SUMMARY OF THE INVENTION

Although the parasitic capacitance is reduced when the active shield is provided, it is not possible to completely eliminate the parasitic capacitance. Therefore, an attempt to obtain higher detection sensitivity may fail due to the effect of the remaining parasitic capacitance. The capacitive sensor disclosed in Japanese Patent No. 4198306 may cause the problem that the output voltage that has been actually output is saturated and sufficiently high detection sensitivity cannot thereby be obtained.

In view of this, a capacitance detection device with high detection sensitivity is desired.

A capacitance detection device according to one respect of the present invention detects a capacitance between a detection electrode and a detection target close to the detection electrode. The capacitance detection device has: a first voltage output circuit that outputs a first alternating current voltage to be supplied to a shield electrode placed so as to be close to the detection electrode; a second voltage output circuit that outputs a second alternating current voltage with substantially the same frequency as the first alternating current voltage; and an operational amplifier that amplifies the difference in voltage between an inverting input terminal connected to the detection electrode and a non-inverting input terminal to which the second alternating current voltage is applied, and outputs the amplified difference in voltage. In a state in which the detection target close to the detection electrode is not present, the second voltage output circuit outputs the second alternating current voltage that has been adjusted so that an output voltage from the operational amplifier has a smaller amplitude than the first alternating current voltage.

The capacitance detection device disclosed in present invention can provide high detection sensitivity.

DESCRIPTION OF THE PREFERRED EMBODIMENTS

Figure 1:
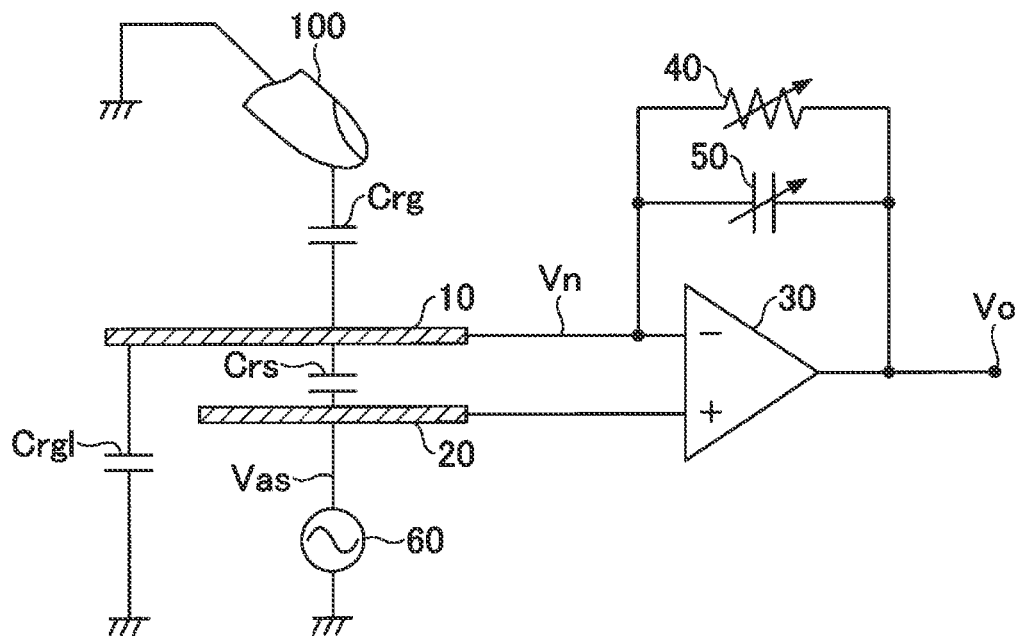
FIG. 1 is a structural diagram of a capacitance detection device having a shield electrode.

Embodiments will be described below. Like members and the like will be given like reference characters and descriptions will be omitted.

First, a capacitance detection device in which a shield electrode is provided will be described. The capacitance detection device illustrated in FIG. 1 has a detection electrode 10, a shield electrode 20, an operational amplifier 30, a feedback resistor 40, a feedback capacitor 50, an alternating current voltage output circuit 60, which is an alternating current power source, and the like.

The detection electrode 10 is connected to the inverting input terminal (−) of the operational amplifier 30. The shield electrode 20 is connected to the non-inverting input terminal (+) of the operational amplifier 30. The feedback resistor 40 and feedback capacitor 50 are connected in parallel between the output terminal of the operational amplifier 30 and its inverting input terminal (−) so that negative feedback is applied. The alternating current voltage output circuit 60 is connected to the shield electrode 20. A voltage Vas, which is an alternating current voltage, is applied to the shield electrode 20. The feedback resistor 40 can change its resistance value. The feedback capacitor 50 can change its capacitance value.

With the capacitance detection device illustrated in FIG. 1, a capacitance Crs is formed between the detection electrode 10 and the shield electrode 20 and a parasitic capacitance Crgl is formed between the detection electrode 10 and ground (GND). A capacitance Crg is formed between the detection electrode 10 and a detection target 100 such as a finger or hand. When the detection target 100 such as a finger or hand approaches the detection electrode 10, the capacitance Crg is increased and the amplitude of an output voltage Vo output from the operational amplifier 30 becomes large.

An effective method of making detection sensitivity high when the detection target 100 such as a finger or hand approaches the detection electrode 10 is to increase the amplitude of the applied voltage Vas, which is output from the alternating current voltage output circuit 60 and is applied to the shield electrode 20. When the amplitude of the applied voltage Vas is increased, however, the output voltage Vo output from operational amplifier 30 has a larger amplitude than the applied voltage Vas.

Figure 2:
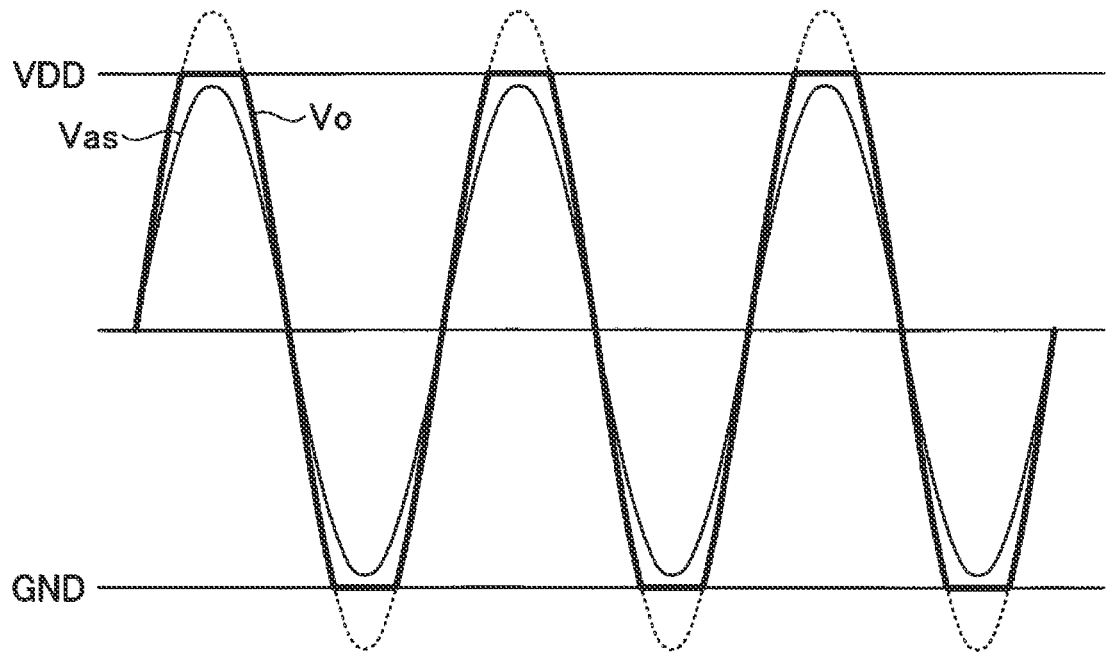
FIG. 2 is an explanatory drawing of the capacitance detection device having the shield electrode.

In the capacitance detection device, however, a power supply voltage VDD becomes an upper limit due to a power supply voltage constraint. As for the output voltage Vo, therefore, a voltage higher than the power supply voltage VDD or a voltage lower than ground potential GND is not output, as illustrated in FIG. 2. The output voltage Vo has a waveform saturated at the top and bottom. Accordingly, detection sensitivity cannot be sufficiently enhanced.

First Embodiment

Next, a capacitance detection device in a first embodiment will be described. With the capacitance detection device in this embodiment, the dynamic range of a detection signal detected by the detection electrode 10 is increased. Specifically, detection sensitivity is improved by reducing an output in a state in which there is no proximity of the detection target 100 such as a finger or hand.

Figure 3:
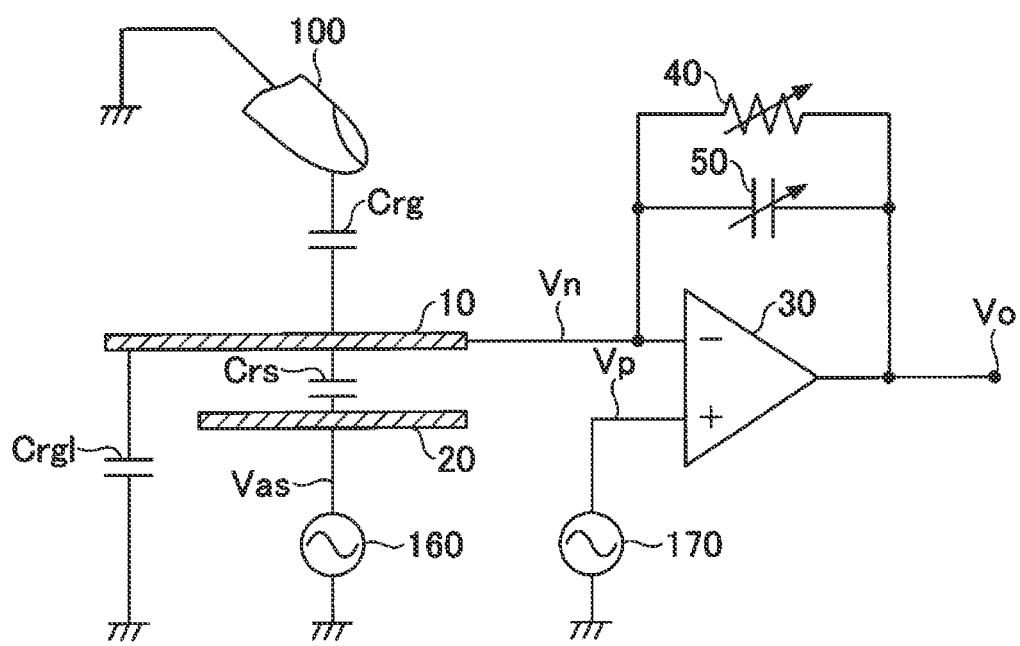
FIG. 3 is a structural diagram of a capacitance detection device in a first embodiment.

The capacitance detection device in this embodiment has the detection electrode 10, the shield electrode 20, the operational amplifier 30, the feedback resistor 40, the feedback capacitor 50, a first voltage output circuit 160, a second voltage output circuit 170, and the like, as illustrated in FIG. 3. The capacitance detection device detects a capacitance between the detection electrode 10 and the detection target 100 close to the detection electrode 10. The detection electrode 10 and shield electrode 20 are placed so as to be close to each other.

The detection electrode 10 is connected to the inverting input terminal (−) of the operational amplifier 30. The shield electrode 20 is connected to the first voltage output circuit 160. The first voltage output circuit 160 outputs a first alternating current voltage Vas to be supplied to the shield electrode 20 placed so as to be close to the detection electrode 10. The second voltage output circuit 170 is connected to the non-inverting input terminal (+) of the operational amplifier 30. The second voltage output circuit 170 outputs a second alternating current voltage Vp with substantially the same frequency as the first alternating current voltage Vas. The feedback resistor 40 and feedback capacitor 50 may be connected in parallel between the output terminal of the operational amplifier 30 and its inverting input terminal (−) so that negative feedback is applied. The capacitance value of the feedback capacitor 50 may be capable of being adjusted. The operational amplifier 30 amplifies the difference in voltage between the inverting input terminal (−) connected to the detection electrode 10 and the non-inverting input terminal (+) to which the second alternating current voltage Vp is applied, and outputs the amplified difference in voltage. The first alternating current voltage Vas output from the first voltage output circuit 160 and the second alternating current voltage Vp output from the second voltage output circuit 170 may have substantially the same phase.

In the capacitance detection device in this embodiment, the capacitance Crs is formed between the detection electrode 10 and the shield electrode 20 and the parasitic capacitance Crgl is formed between the detection electrode 10 and GND. The capacitance Crg is formed between the detection electrode 10 and the detection target 100, such as a finger or hand, which is a detection target. When the detection target 100 such as a finger or hand approaches the detection electrode 10, the capacitance Crg is increased and the amplitude of the output voltage Vo output from the operational amplifier 30 becomes large.

Figure 4:
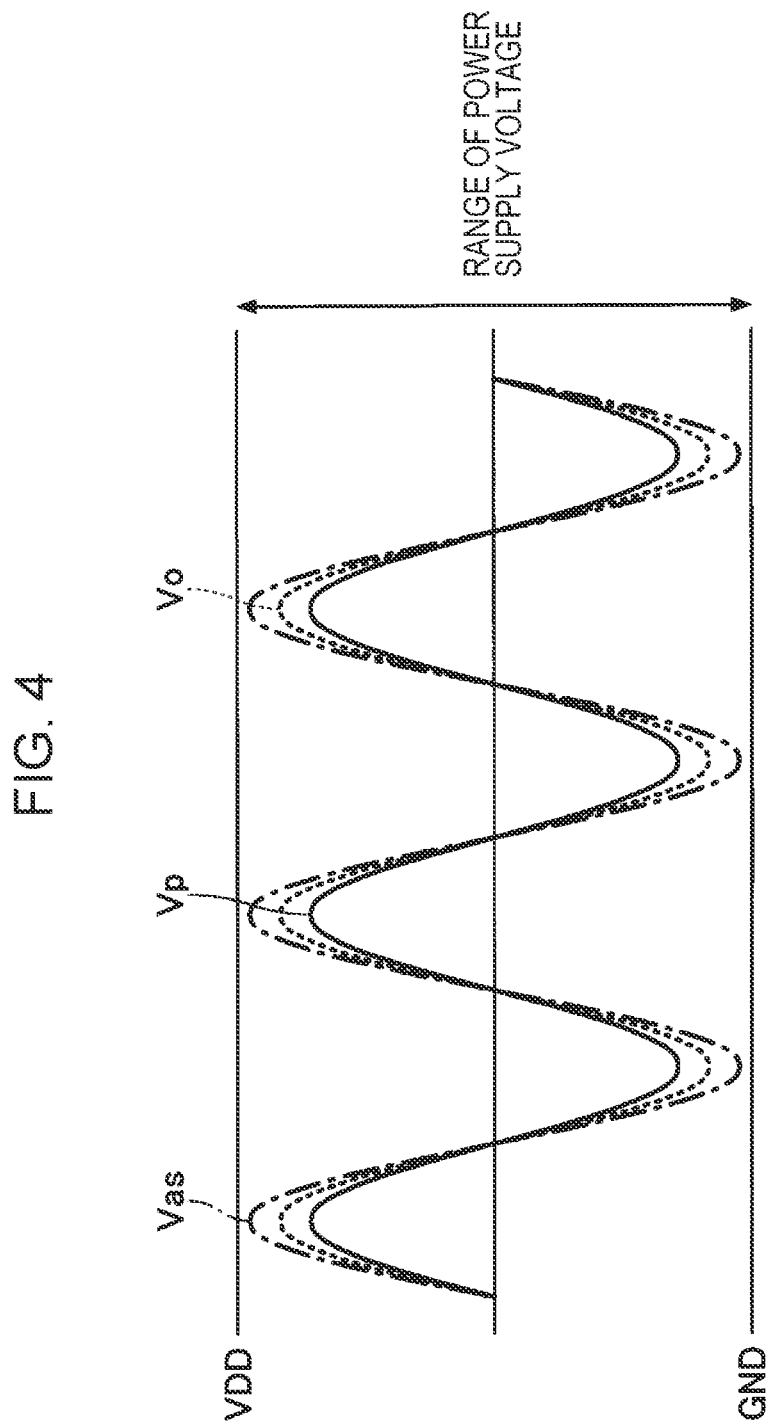
FIG. 4 is a first explanatory drawing of the capacitance detection device in the first embodiment.

In this embodiment, in a state in which the detection target 100 close to the detection electrode 10 is not present, the second voltage output circuit 170 outputs the second alternating current voltage Vp that has been adjusted so that the output voltage Vo from the operational amplifier 30 has a smaller amplitude than the first alternating current voltage Vas. In other words, in a state in which the detection target 100 such as a finger or hand is not present in the vicinity of the detection electrode 10 and the detection target 100 is not recognized, the amplitude of the second alternating current voltage Vp output from the second voltage output circuit 170 is set so that the amplitude of the output voltage Vo and the amplitude of the first alternating current voltage Vas satisfy Vas>Vo. This state is illustrated in FIG. 4. As long as the relationship Vas>Vo is satisfied, the second voltage output circuit 170 may use any method to adjust the amplitude of the second alternating current voltage Vp. For example, the second voltage output circuit 170 may monitor the amplitude value of Vas and the amplitude value of Vo, and may automatically adjust the amplitude of the second alternating current voltage Vp so that the relationship Vas>Vo is satisfied. Alternatively, the amplitude of the second alternating current voltage Vp may be manually adjusted so that the relationship Vas>Vo is satisfied. Alternatively, as the second alternating current voltage Vp, the second voltage output circuit 170 may output a voltage resulting from attenuating the first alternating current voltage Vas, as in a second embodiment, which will be described later.

Thus, the amplitude of the first alternating current voltage Vas output from the first voltage output circuit 160 becomes the amplitude of the highest voltage, so the dynamic range can be increased to the fullest extent and detection sensitivity can be enhanced. In this application, the symbols Vas, Vp, and Vo used together with inequality signs and the like will respectively refers to the amplitude of the first alternating current voltage Vas, the amplitude of the second alternating current voltage Vp, and the amplitude of the output voltage Vo.

Figure 5:
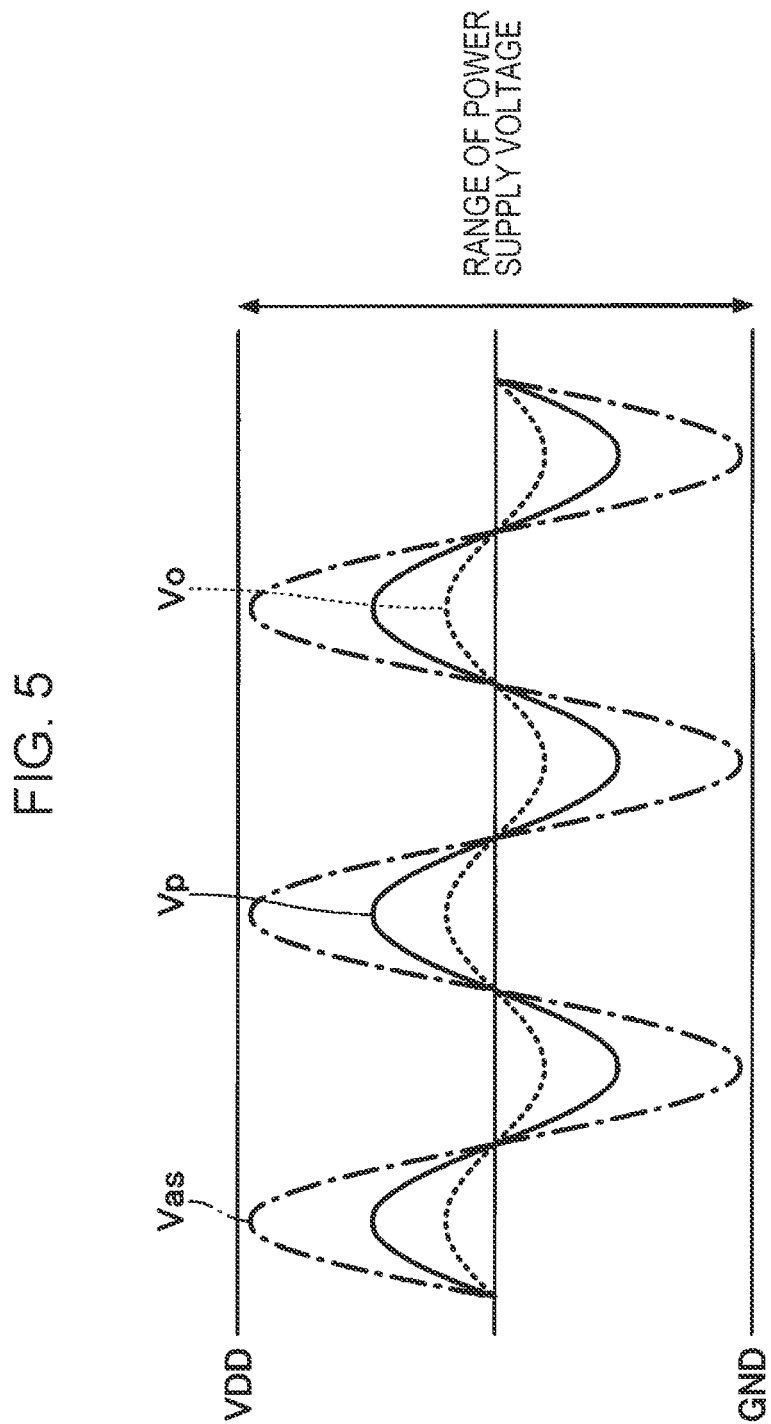
FIG. 5 is a second explanatory drawing of the capacitance detection device in the first embodiment.

Also, in this embodiment, the amplitude of the second alternating current voltage Vp output from the second voltage output circuit 170 may be set so that Vp<Crs×Vas/(Crs+Crgl) or Vo<Vp<Vas is satisfied. This state is illustrated in FIG. 5.

Thus, the amplitude of the output voltage Vo can be further reduced in the state in which the detection target 100 such as a finger or hand is not detected. Therefore, it is possible to make the output voltage Vo less likely to be saturated, to increase a voltage gain determined by the feedback capacitor 50, and to improve detection sensitivity.

That is, when the output voltage from the operational amplifier 30 is denoted Vo, the first alternating current voltage is denoted Vas, and the second alternating current voltage is denoted Vp, in a state in which the detection target 100 close to the detection electrode 10 is not present, the second voltage output circuit 170 may output the second alternating current voltage Vp adjusted so that the amplitude relationship satisfies Vo<Vp<Vas.

Alternatively, when the first alternating current voltage is denoted Vas, the second alternating current voltage is denoted Vp, the capacitance between the detection electrode 10 and the shield electrode 20 is denoted Crs, and the parasitic capacitance between the detection electrode 10 and GND other than the detection target is denoted Crgl, in the state in which the detection target 100 close to the detection electrode 10 is not present, the second voltage output circuit 170 may output the second alternating current voltage Vp adjusted so that Vp<Crs×Vas/(Crs+Crgl) is satisfied.

In a capacitance detection method in this embodiment, a capacitance is detected between d the detection electrode 10 and the detection target 100 close to the detection electrode 10. The method has: a first voltage output step of outputting the first alternating current voltage Vas to be supplied to the shield electrode 20 placed so as to be close to the detection electrode 10; a second voltage output step of outputting the second alternating current voltage Vp with substantially the same frequency and phase as the first alternating current voltage Vas; and an operational amplification step of amplifying, in the operational amplifier 30, the difference in voltage between the inverting input terminal (−) connected to the detection electrode 10 and the non-inverting input terminal (+) to which the second alternating current voltage Vp is applied, and outputting the amplified difference in voltage. The second voltage output step is to output, in a state in which the detection target 100 close to the detection electrode 10 is not present, the second alternating current voltage Vp that has been adjusted so that the output voltage Vo from the operational amplifier 30 has a smaller amplitude than the first alternating current voltage Vas.

In this embodiment, since the first alternating current voltage Vas output from the first voltage output circuit 160 and the second alternating current voltage Vp output from the second voltage output circuit 170 are separated from each other, Vas>Vp can be easily satisfied as the relationship of the amplitudes of voltages. This can reduce the amplitude of the output voltage Vo.

Figure 6:
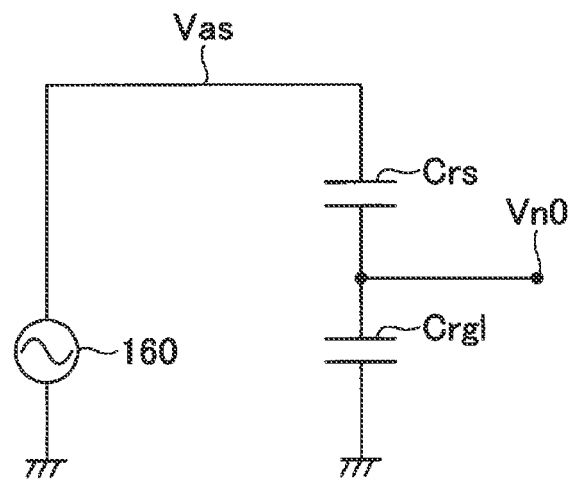
FIG. 6 is a third explanatory drawing of the capacitance detection device in the first embodiment.
Figure 7:
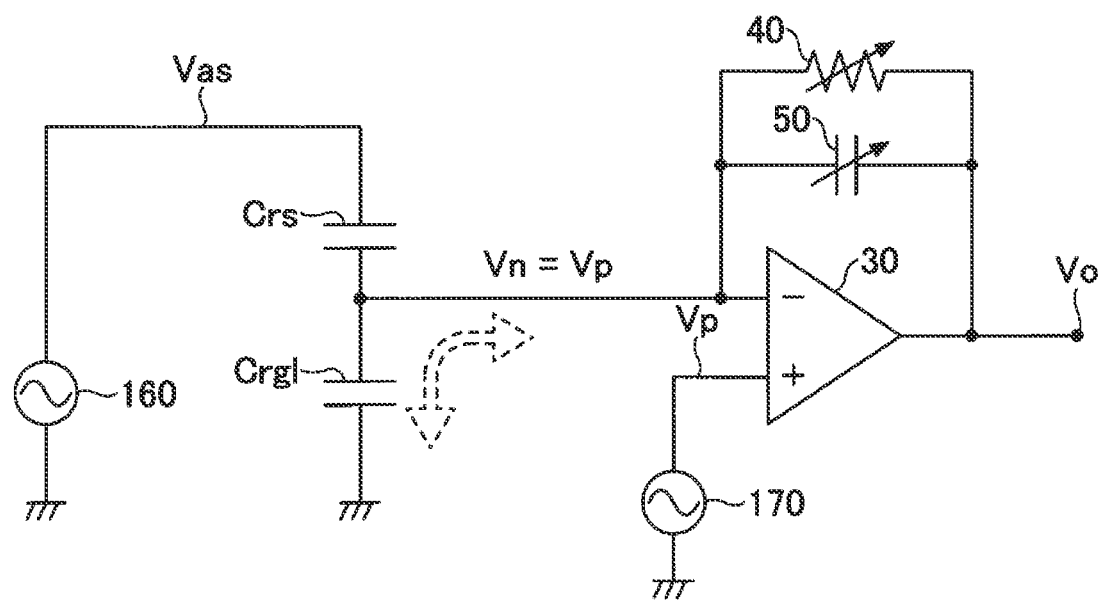
FIG. 7 is a fourth explanatory drawing of the capacitance detection device in the first embodiment.

FIG. 6 indicates an equivalent circuit of the detection electrode 10 in a state in which the detection target 100 is not present in the vicinity of the detection electrode 10. Vn0 refers to the voltage at a node of the detection electrode 10 in a state in which the operational amplifier 30 is not connected. As illustrated in FIG. 7, when the detection electrode 10 is connected to the inverting input terminal (−) of the operational amplifier 30, if the amplitude of the second alternating current voltage Vp is large, the amount of current that flows into the parasitic capacitance Crgl is increased, as indicated by the dashed arrow. Therefore, even if the amplitude of the first alternating current voltage Vas is increased to the fullest extent, by reducing the amplitude of the second alternating current voltage Vp, the amplitude of the output voltage Vo can be reduced in the state in which the detection target 100 is not present in the vicinity of the detection electrode 10.

Figure 8:
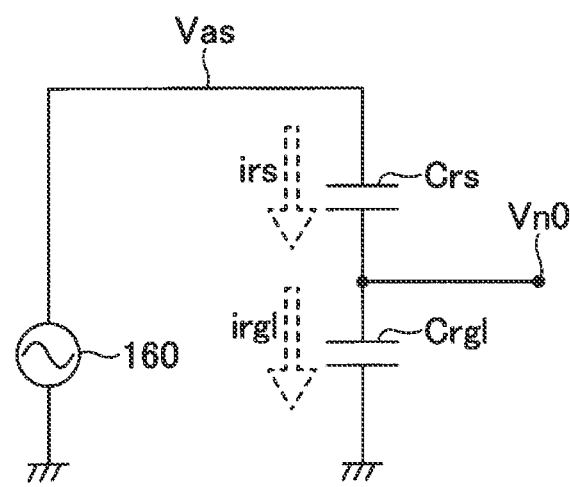
FIG. 8 is a fifth explanatory drawing of the capacitance detection device in the first embodiment.

Also, in the equivalent circuit illustrated in FIG. 6, when the voltage Vn0 is calculated as illustrated in FIG. 8, Vn0=Crs×Vas/(Crs+Crgl) holds. The value of this Vn0 is obtained by multiplying a ratio (Crs/(Crs+Crgl)), which is determined from the capacitance Crs and parasitic capacitance Crgl, by the first alternating current voltage Vas. With the operational amplifier 30 not connected to the detection electrode 10, a current irs flowing in the capacitance Crs and a current irgl flowing in the parasitic capacitance Crgl have the same value. In FIGS. 8 to 11, the orientation of each arrow represents the direction of a current at some time. The orientation changes depending on the polarity in the voltage change of the first alternating current voltage Vas.

Figure 9:
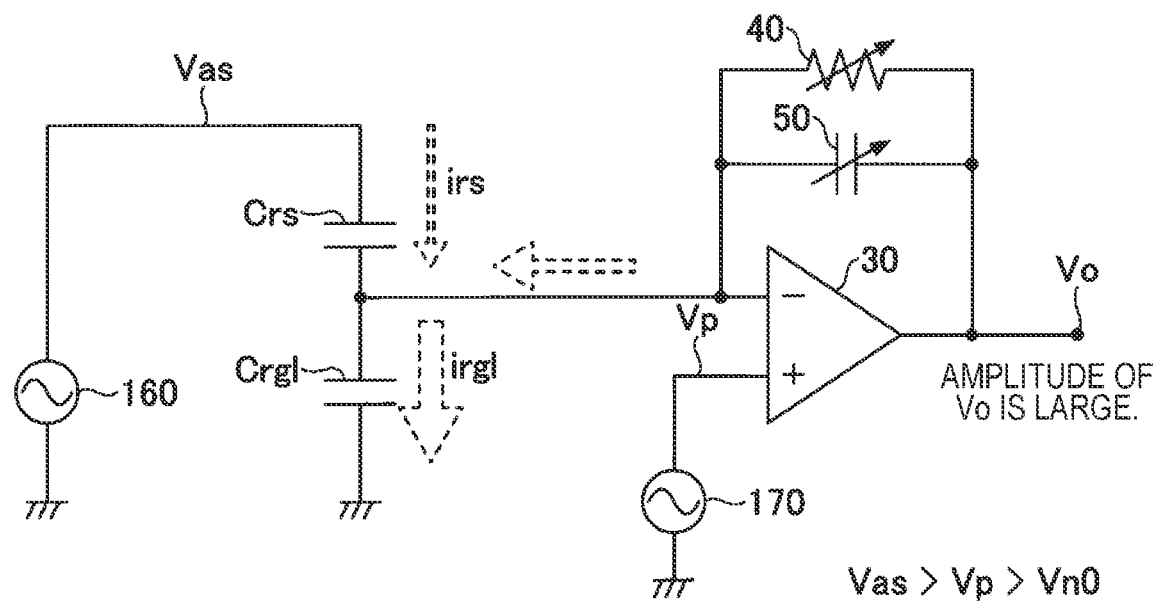
FIG. 9 is a sixth explanatory drawing of the capacitance detection device in the first embodiment.

When Vas>Vp>Vn0 holds as illustrated in FIG. 9, currents follow as indicated by the dashed arrows; the amount of current irgl flowing in the parasitic capacitance Crgl becomes larger than the amount of current irs flowing in the capacitance Crs. Therefore, the output voltage Vo has a larger amplitude than the second alternating current voltage Vp.

Figure 10:
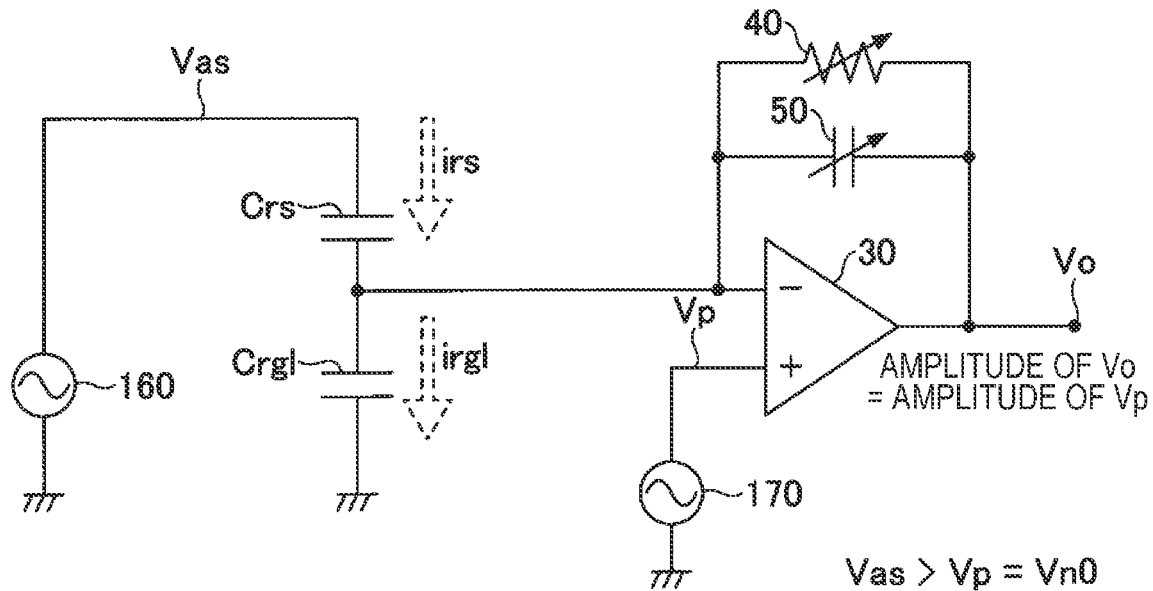
FIG. 10 is a seventh explanatory drawing of the capacitance detection device in the first embodiment.

When Vas>Vp=Vn0 holds as illustrated in FIG. 10, currents follow as indicated by the dashed arrows; the amount of current irs flowing in the capacitance Crs and the amount of current irgl flowing in the parasitic capacitance Crgl become the same. Therefore, the output voltage Vo has the same amplitude as the amplitude of the second alternating current voltage Vp.

Figure 11:
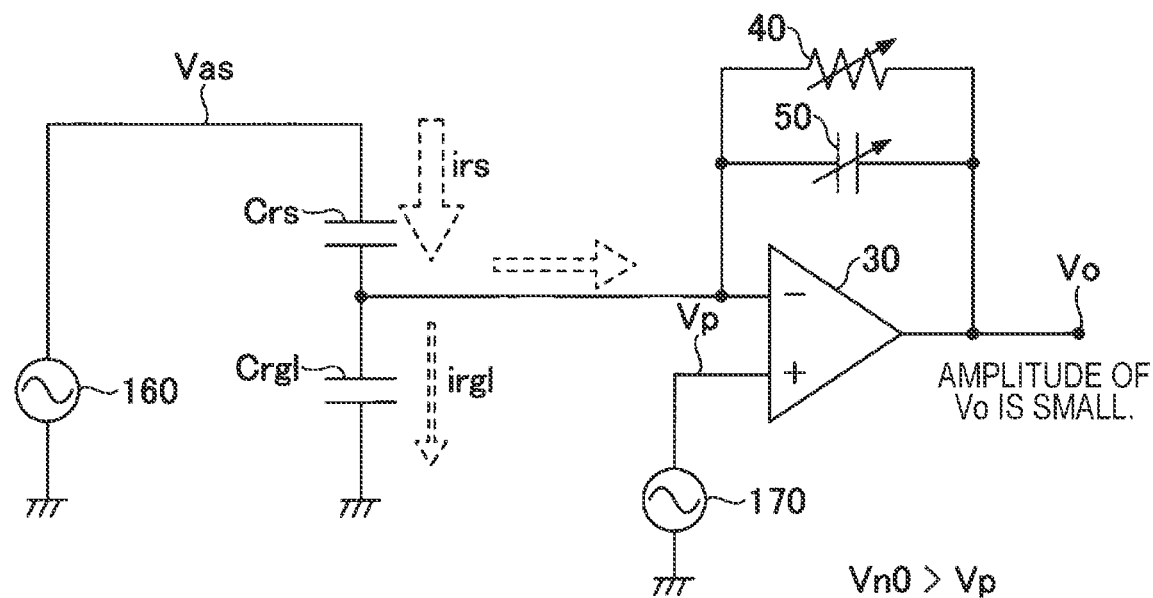
FIG. 11 is an eighth explanatory drawing of the capacitance detection device in the first embodiment.

When Vn0>Vp holds as illustrated in FIG. 11, currents follow as indicated by the dashed arrows; the amount of current irs flowing in the capacitance Crs becomes larger than the amount of current irgl flowing in the parasitic capacitance Crgl. Therefore, the output voltage Vo has smaller amplitude than the second alternating current voltage Vp. This means that the condition Vp<Crs×Vas/(Crs+Crgl) described above is synonymous with the condition Vo<Vp<Vas.

Therefore, by adjusting the amplitude of the second alternating current voltage Vp output from the second voltage output circuit 170, the amplitude of the output voltage Vo can be reduced, making the output voltage Vo from the operational amplifier 30 less likely to be saturated. Therefore, even if noise or the like is entered, filtering processing is possible at a subsequent stage while linearity is kept.

Therefore, in a state in which the detection target 100 is not present in the vicinity of the detection electrode 10, when an adjustment is made so that the output voltage Vo and second alternating current voltage Vp become the same, the amplitude of the output voltage Vo can be lowered only to the amplitude of the second alternating current voltage Vp, so the effect of enhancing detection sensitivity is not sufficient. With the capacitance detection device in this embodiment, however, the amplitude of the output voltage Vo can be made lower than the amplitude of the second alternating current voltage Vp. Therefore, high detection sensitivity and resistance to noise can be obtained.

Input Device

Figure 12:
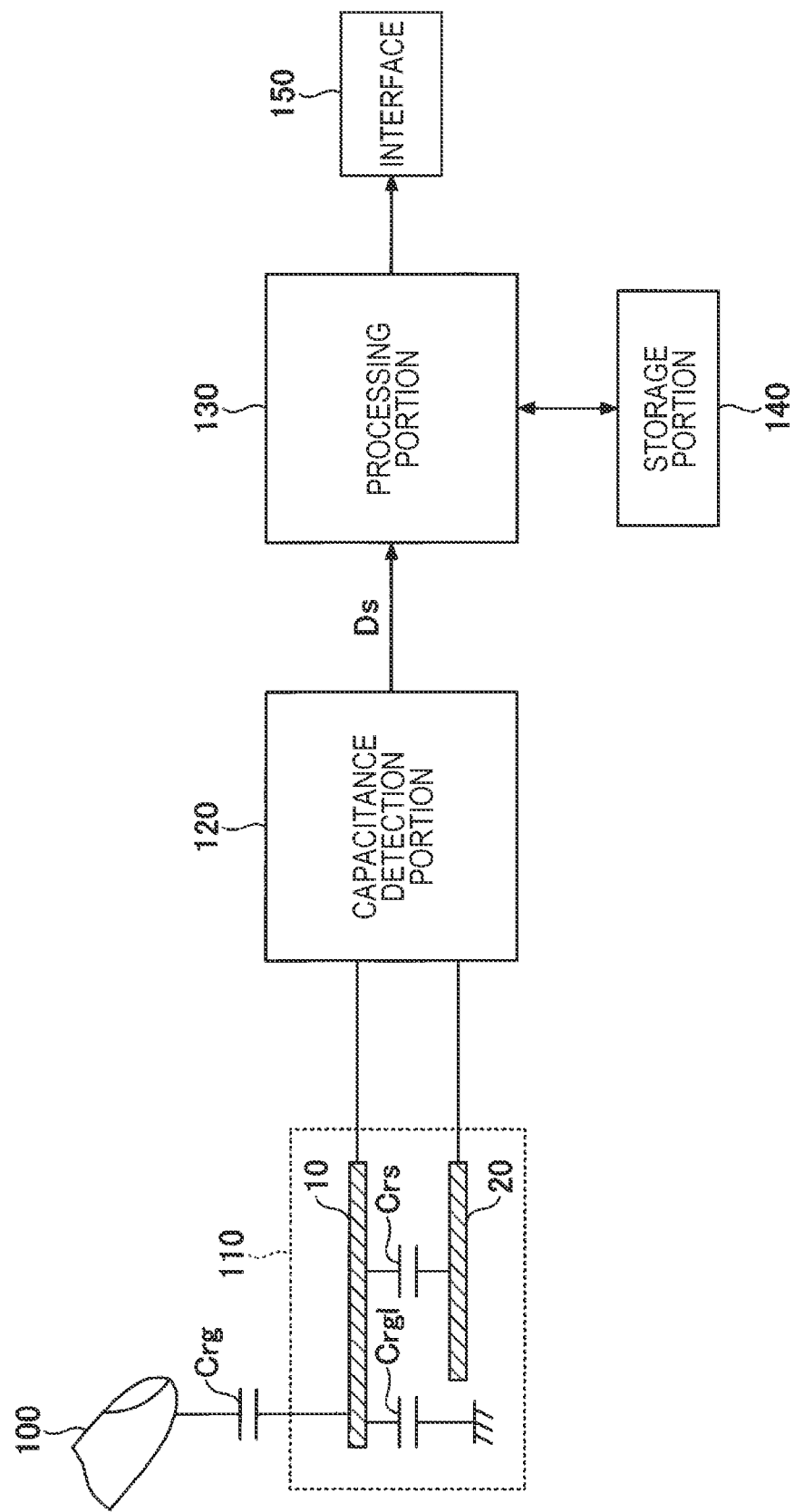
FIG. 12 is a structural diagram of an input device in the first embodiment.

Next, an input device in which the capacitance detection device in this embodiment is used will be described. The input device in this embodiment has a sensor portion 110, a capacitance detection portion 120, a processing portion 130, a storage portion 140, an interface portion 150, and the like, as illustrated in FIG. 12. The capacitance detection device in this embodiment is composed of the sensor portion 110 and part of the capacitance detection portion 120.

The input device in this embodiment detects a capacitance between an electrode provided in the sensor portion 110 and the detection target 100 such as a finger or pen when the detection target 100 approaches the sensor portion 110. Information matching the proximity of the detection target 100 is entered according to the result of this detection. For example, the input device acquires information such as the presence or absence of the proximity of the detection target 100 to the sensor portion 110 and the distance between the sensor portion 110 and the detection target 100, according to the detection result of the capacitance. The input device is applied to a user interface device such as, for example, a touch sensor or touch pad. The word "proximity", the words "close to" and the like in this description refer to that two things are close to each other, regardless of whether the two things are in contact with each other or the two things are not in contact with each other.

The sensor portion 110 has the detection electrode 10 used to detect the proximity of the detection target 100 such as a finger or pen, and also has the shield electrode 20 placed so as to be close to the detection electrode 10. The detection electrode 10 is placed in an area, in the sensor portion 110, toward which the detection target 100 moves. For example, the surface of a detection area for the detection target 100 is covered with an insulative cover layer, and the detection electrode 10 is placed below the cover layer. The shield electrode 20 is a shield used to prevent electrostatic coupling between the detection electrode 10 and a conductor other than the detection target 100 and to prevent external noise such as an electromagnetic wave. The shield electrode 20 is placed opposite to the detecting surface of the detection area for the detection target 100, with the detection electrode 10 sandwiched.

The capacitance detection portion 120 detects the capacitance value of the capacitance Crg formed between the detection target 100 and the detection electrode 10, and outputs a signal Ds, which indicates a detection result.

The processing portion 130 is a circuit that controls the overall operation of the input device. For example, the processing portion 130 includes a computer that executes processing in response to operation codes in a program stored in the storage portion 140 as well as a logic circuit that implements a particular function. Processing by the processing portion 130 may be implemented in the computer, according to the program. Alternatively, at least part of processing by the processing portion 130 may be implemented by a special logic circuit.

The processing portion 130 decides whether the detection target 100 is close to the sensor portion 110, in response to the signal Ds indicating a detection result, the signal Ds being output from the capacitance detection portion 120. The processing portion 130 also calculates the distance between the detection target 100 and the sensor portion 110 as well as the positional coordinates of the detection target 100. The sensor portion 110 may include a plurality of detection electrodes 10. The capacitance detection portion 120 may detect the capacitance value of the capacitance Crg for each of the plurality of detection electrodes 10.

The processing portion 130 also performs processing, which will be described later, for changing the frequency of the first alternating current voltage Vas of the capacitance detection portion 120 to prevent the detection sensitivity of the capacitance detection portion 120 from being lowered by the effect of external noise.

The storage portion 140 stores programs for the computer, which is part of the processing portion 130, data used in processing in the processing portion 130, data temporarily held in a processing process, and the like. The storage portion 140 is structured by using a storage device such as, for example, a dynamic random access memory (DRAM), a static random access memory (SRAM), a flash memory, or a hard disk drive.

The interface portion 150 is a circuit used to transmit and receive data between the input device and another device (such as, for example, a host controller for an electronic unit in which the input device is mounted). The processing portion 130 outputs information (such as the presence or absence of the detection target 100, the proximity position of the detection target 100, the distance from the detection target 100, the size of the detection target 100, and the like) obtained according to the detection result from the capacitance detection portion 120 to a high-end device (not illustrated) through the interface portion 150. The high-end device uses the information to form a user interface that recognizes, for example, a pointing manipulation, a gesture manipulation, and the like.

Second Embodiment

Figure 13:
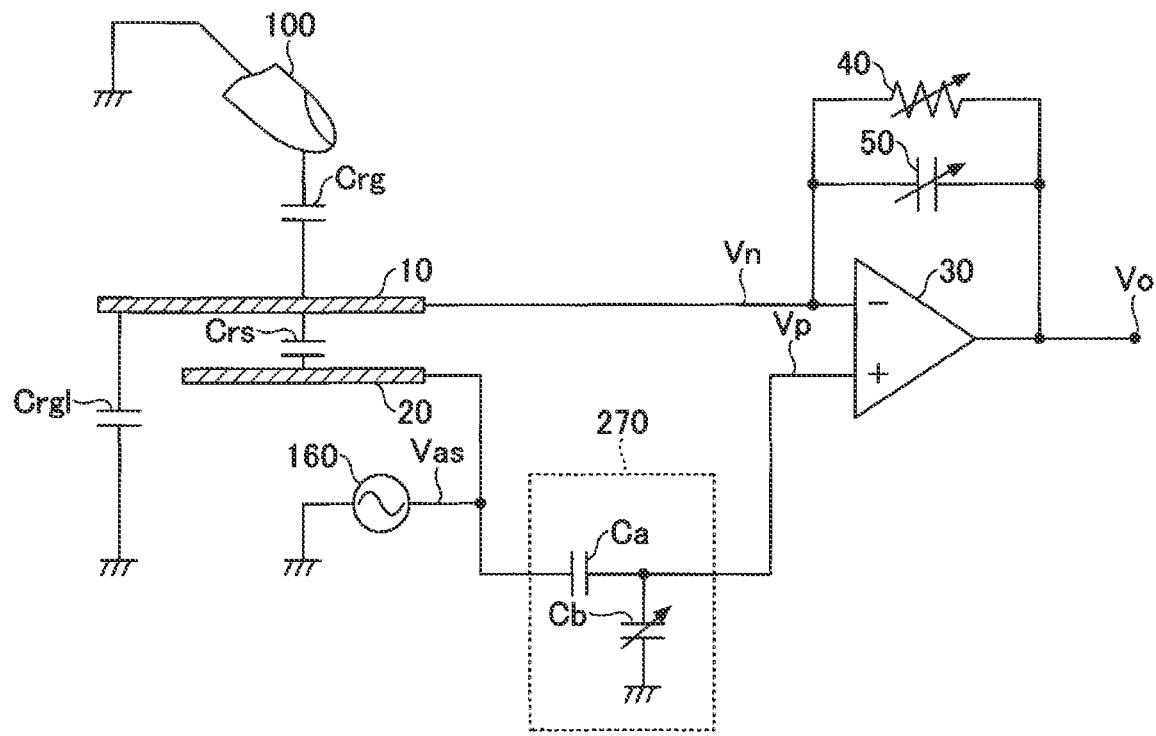
FIG. 13 is a structural diagram of an input device including a capacitance detection device in a second embodiment.

Next, a second embodiment will be described. FIG. 13 illustrates an input device that has a capacitance detection device in the second embodiment.

A second voltage output circuit 270 in the capacitance detection device in the second embodiment is, for example, an attenuator. As the second alternating current voltage Vp, the second voltage output circuit 270 may output a voltage resulting from attenuating the first alternating current voltage Vas. The second voltage output circuit 270 may include a series circuit composed of a first capacitor Ca and a second capacitor Cb. The first voltage output circuit 160 may apply the first alternating current voltage Vas across this series circuit. As a result of the first alternating current voltage Vas being divided by the first capacitor Ca and second capacitor Cb, the second alternating current voltage Vp may develop at the second capacitor Cb. One of the terminals of the first capacitor Ca is connected to the input terminal of the second voltage output circuit 270. The other of the terminals of the first capacitor Ca is connected to one of the terminals of the second capacitor Cb. The other of the terminals of the second capacitor Cb is connected to ground.

Therefore, as the second alternating current voltage Vp, the second voltage output circuit 270 may output a voltage resulting from attenuating the first alternating current voltage Vas.

That is, the second voltage output circuit 270 may generate the second alternating current voltage Vp resulting from dividing the first alternating current voltage Vas through the first capacitor Ca and second capacitor Cb.

In a state in which the detection target 100 close to the detection electrode 10 is not present, the second voltage output circuit 270 may output the second alternating current voltage Vp that has been adjusted so that the output voltage Vo from the operational amplifier 30 has a smaller amplitude than the first alternating current voltage Vas, as in the case of the capacitance detection device in the first embodiment. In other words, the second voltage output circuit 270 may include the first capacitor Ca and second capacitor Cb that have a capacitance ratio adjusted so as to develop the second alternating current voltage Vp by which the output voltage Vo from the operational amplifier 30 may have a smaller amplitude than the first alternating current voltage Vas in a state in which the detection target 100 close to the detection electrode 10 is not present.

The second voltage output circuit 270 may include the second capacitor Cb that has a variable capacitance value.

According to this embodiment, as the second alternating current voltage Vp, a voltage resulting from attenuating the first alternating current voltage Vas may be output from the second voltage output circuit 270. When the second alternating current voltage Vp is generated by using an attenuator that does not include any active elements such as transistors and the like, noise in the second alternating current voltage Vp becomes small, so the detection sensitivity for the capacitance value of the capacitance Crg can be enhanced.

According to this embodiment, the first alternating current voltage Vas is applied to the series circuit composed of the first capacitor Ca and second capacitor Cb, and the second alternating current voltage Vp matching the first alternating current voltage Vas develops at the second capacitor Cb. Thus, noise becomes smaller than when an attenuator based on a resistor is used. This can enhance detection sensitivity for the capacitance value of the capacitance Crg.

Contents other than the above are similar as in the first embodiment. Therefore, in a state in which the detection target 100 close to the detection electrode 10 is not present, when the output voltage from the operational amplifier 30 is denoted Vo, the first alternating current voltage is denoted Vas, and the second alternating current voltage is denoted Vp, the second voltage output circuit 270 may output the second alternating current voltage Vp adjusted so that the amplitude relationship satisfies Vo<Vp<Vas, as in the first embodiment. In this case, the amplitude of the output voltage Vo can be further reduced in the state in which the detection target 100 such as a finger or hand is not detected. Therefore, it is possible to make the output voltage Vo less likely to be saturated, to increase a voltage gain determined by the feedback capacitor 50, and to improve detection sensitivity.

So far, embodiments have been described in detail. However, the present invention is not limited to particular embodiments. Various variations and modifications are possible without departing from the scope of the claims.

What is claimed is:

1. A capacitance detection device for detecting a capacitance formed between a detection electrode and a detection target approaching thereto, the capacitance detection device comprising:
   the detection electrode;
   a shield electrode placed in a vicinity of the detection electrode;
   a first voltage output circuit configured to supply a first alternating current voltage to the shield electrode;
   a second voltage output circuit configured to output a second alternating current voltage having a frequency substantially the same as a frequency of the first alternating current voltage; and
   an operational amplifier having an inverting input terminal and a non-inverting input terminal, the inverting input terminal being connected to the detection electrode, and the non-inverting input terminal being connected the second voltage output circuit to receive the second alternating current voltage, the operational amplifier amplifying a voltage difference between the inverting input terminal and the non-inverting input terminal thereby outputting an amplified voltage difference as an output voltage,
   wherein the second voltage output circuit is further configured to adjust an amplitude of the second alternating current voltage such that, when no detection target approaches the detection electrode, the output voltage from the operational amplifier has an amplitude smaller than that of the first alternating current voltage.

2. The capacitance detection device according to claim 1, wherein the first alternating current voltage and the second alternating current voltage have substantially the same phase.

3. The capacitance detection device according to claim 1, further comprising a feedback capacitor provided between the inverting input terminal and an output terminal of the operational amplifier.

4. The capacitance detection device according to claim 3, wherein the feedback capacitor is a variable capacitor.

5. The capacitance detection device according to claim 1, wherein the second voltage circuit is configured to output the second alternating current voltage by attenuating the first alternating current voltage.

6. The capacitance detection device according to claim 5, wherein the second voltage output circuit includes a series circuit composed of a first capacitor and a second capacitor; and
   wherein the first voltage output circuit applies the first alternating current voltage across the series circuit, and the second voltage output circuit generates the second alternating current voltage by dividing the first alternating current voltage through the first capacitor and the second capacitor.

7. The capacitance detection device according to claim 6, wherein the first capacitor and the second capacitor are configured to have such a capacitance ratio that the second alternating current voltage input to the non-inverting terminal of the operational amplifier results in the output voltage thereof having the amplitude smaller than that of the first alternating current voltage, when no detection target approaches the detection electrode.

8. The capacitance detection device according to claim 6, wherein the second capacitor is a variable capacitor.

9. The capacitance detection device according to claim 1, wherein the second voltage output circuit is configured to adjust the amplitude of the second alternating current voltage such that, when no detection target approaches the detection electrode, the second alternating current voltage satisfies a following relationship:

$$Vo<Vp<Vas$$

where Vo is the amplitude of the output voltage from the operational amplifier, Vas is the amplitude of the first alternating current voltage, and Vp is the amplitude of the second alternating current voltage.

10. The capacitance detection device according to claim 1, wherein the second voltage output circuit is configured to adjust the amplitude of the second alternating current voltage such that, when no detection target approaches the detection electrode, the second alternating current voltage satisfies a following relationship:

$$Vp<Crs\times Vas/(Crs+Crgl)$$

where Vas is the amplitude of the first alternating current voltage, Vp is the amplitude of the second alternating current voltage, Crs is a capacitance between the detection electrode and the shield electrode, and Crgl is a parasitic capacitance between the detection electrode and ground other than the detection target.

11. A capacitance detection method of detecting a capacitance between a detection electrode and a detection target approaching the detection electrode, the method comprising:
- supplying a first alternating current voltage to a shield electrode placed in a vicinity of the detection electrode;
- generating a second alternating current voltage having a frequency and a phase substantially the same as a frequency and a phase of the first alternating current voltage;
- applying an output from the detection electrode to an inverting input terminal of an operational amplifier;
- applying the second alternating current voltage to a non-inverting input terminal of the operational amplifier; and
- amplifying, via the operational amplifier, a voltage difference between the inverting input terminal and the non-inverting input terminal, thereby outputting an amplified voltage difference as an output voltage,
- wherein the generating the second alternating current voltage includes adjusting an amplitude of the second alternating current voltage such that, when no detection target approaches the detection electrode, the output voltage from the operational amplifier has an amplitude smaller than that of the first alternating current voltage.

* * * * *